(12) United States Patent
Dewey et al.

(10) Patent No.: US 10,930,791 B2
(45) Date of Patent: Feb. 23, 2021

(54) SYSTEMS, METHODS, AND APPARATUSES FOR IMPLEMENTING BI-LAYER SEMICONDUCTING OXIDES IN SOURCE AND DRAIN FOR LOW ACCESS AND CONTACT RESISTANCE OF THIN FILM TRANSISTORS

(71) Applicant: Intel Corporation, Santa Clara, CA (US)

(72) Inventors: Gilbert Dewey, Hillsboro, OR (US); Van H. Le, Portland, OR (US); Rafael Rios, Austin, TX (US); Shriram Shivaraman, Hillsboro, OR (US); Jack T. Kavalieros, Portland, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1 day.

(21) Appl. No.: 16/325,164

(22) PCT Filed: Sep. 30, 2016

(86) PCT No.: PCT/US2016/054841
§ 371 (c)(1),
(2) Date: Feb. 12, 2019

(87) PCT Pub. No.: WO2018/063343
PCT Pub. Date: Apr. 5, 2018

(65) Prior Publication Data
US 2020/0066912 A1    Feb. 27, 2020

(51) Int. Cl.
*H01L 29/78* (2006.01)
*H01L 29/786* (2006.01)
*H01L 29/221* (2006.01)
*H01L 29/66* (2006.01)

(52) U.S. Cl.
CPC ........ *H01L 29/7869* (2013.01); *H01L 29/221* (2013.01); *H01L 29/66742* (2013.01); *H01L 29/78618* (2013.01)

(58) Field of Classification Search
CPC .................................................. H01L 29/7869
See application file for complete search history.

(56) References Cited

U.S. PATENT DOCUMENTS 5,559,357 A    9/1996    Krivokapic et al.
6,319,799 B1   11/2001   Ouyang et al.
(Continued)

OTHER PUBLICATIONS

International Preliminary Report on Patentability for International Patent Application No. PCT/US2016/054841 dated Apr. 11, 2019, 11 pgs.
(Continued)

*Primary Examiner* — Khiem D Nguyen
*Assistant Examiner* — Laura M Dykes
(74) *Attorney, Agent, or Firm* — Schwabe, Williamson & Wyatt, P.C.

(57) ABSTRACT

In accordance with disclosed embodiments, there are provided systems, methods, and apparatuses for implementing bi-layer semiconducting oxides in a source/drain for low access and contact resistance of thin film transistors. For instance, there is disclosed in accordance with one embodiment a semiconductor device having therein a substrate; a bi-layer oxides layer formed from a first oxide material and a second oxide material, the first oxide material comprising a semiconducting oxide material and having different material properties from the second oxide material comprising a high mobility oxide material; a channel layer formed atop the substrate, the channel layer formed from the semiconducting oxide material of the bi-layer oxides layer; a high mobility oxide layer formed atop the channel layer, the high conductivity oxide layer formed from the high mobility (Continued)

oxide material of the bi-layer oxides layer; metallic contacts formed atop the high mobility oxide layer; a gate and a gate oxide material formed atop the high mobility oxide layer, the gate oxide material being in direct contact with the high mobility oxide layer; and spacers separating the metallic contacts from the gate and gate oxide material. Other related embodiments are disclosed.

16 Claims, 13 Drawing Sheets

(56) References Cited

U.S. PATENT DOCUMENTS

| | | |
|---|---|---|
| 6,455,383 B1 | 9/2002 | Wu |
| 2005/0280102 A1 | 12/2005 | Oh et al. |
| 2009/0140352 A1 | 6/2009 | Lee |
| 2010/0006834 A1 | 1/2010 | Kim et al. |
| 2011/0248270 A1 | 10/2011 | Fukumoto |
| 2017/0236842 A1* | 8/2017 | Matsuda ............. H01L 27/1222 257/43 |

OTHER PUBLICATIONS

International Search Report and Written Opinion for International Patent Application No. PCT/US2016/054841 dated Jun. 29, 2017, 14 pgs.

Office Action from Taiwan Patent Application No. 106129030 dated Dec. 2, 2020, 6 pgs.

* cited by examiner

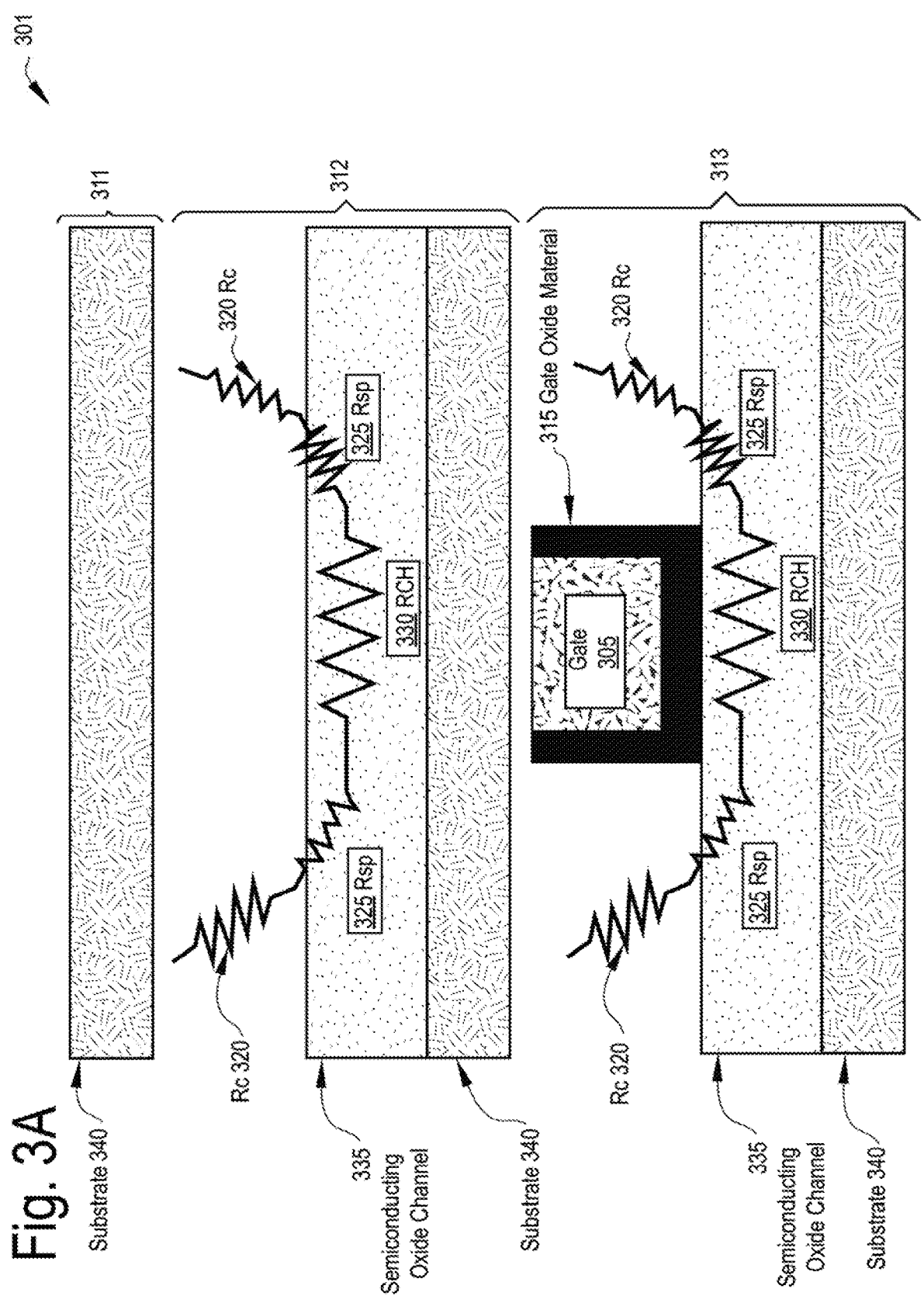

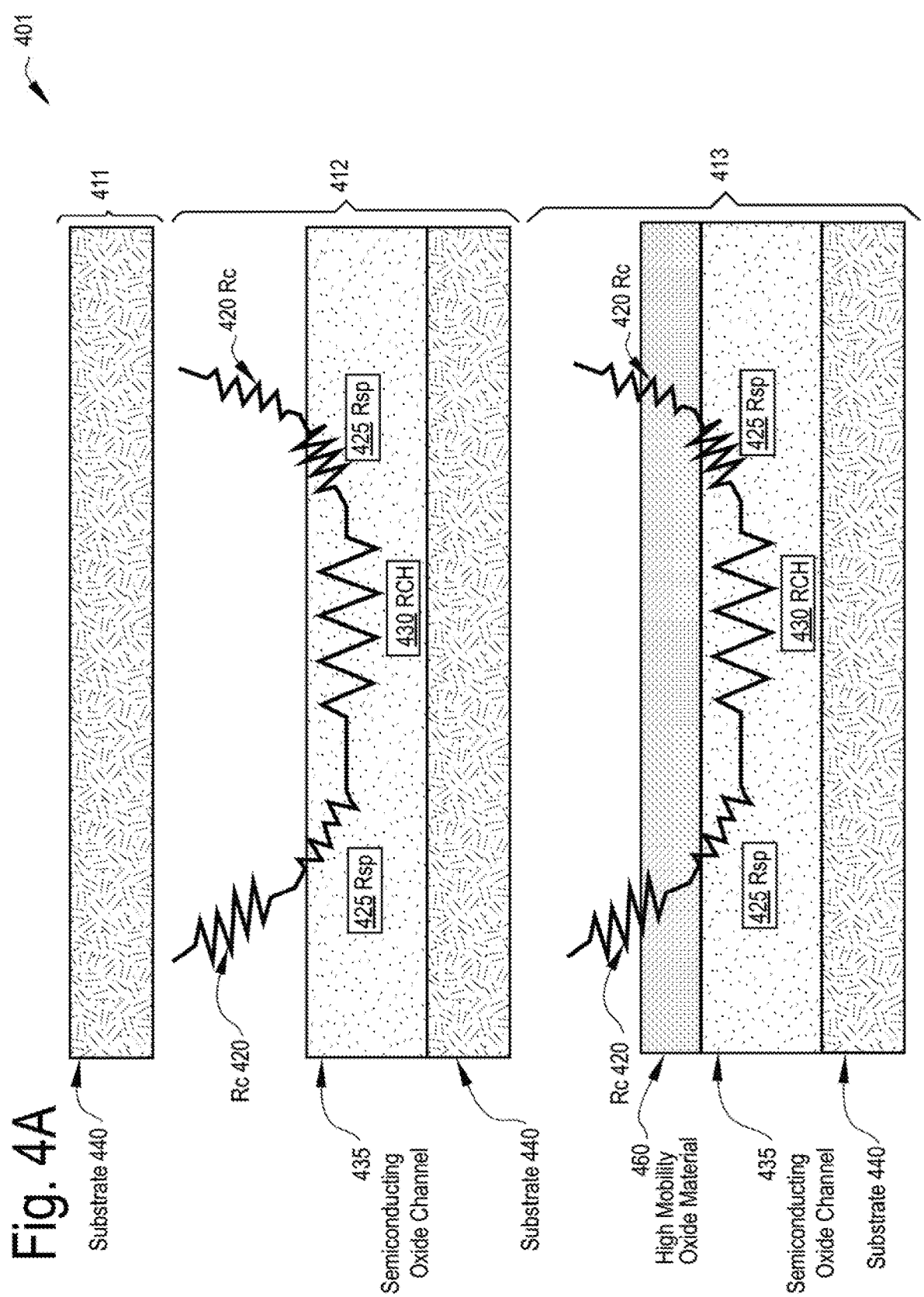

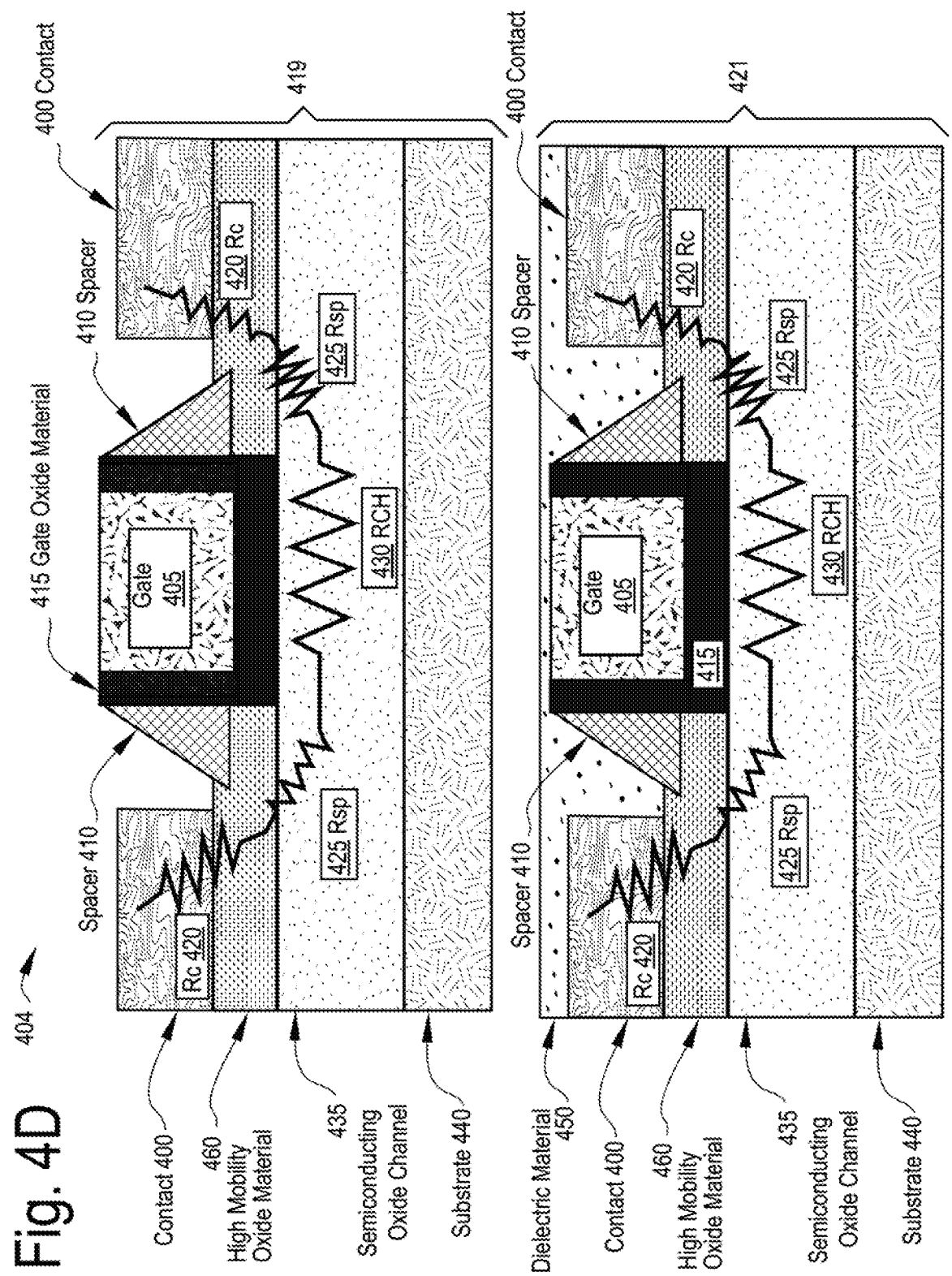

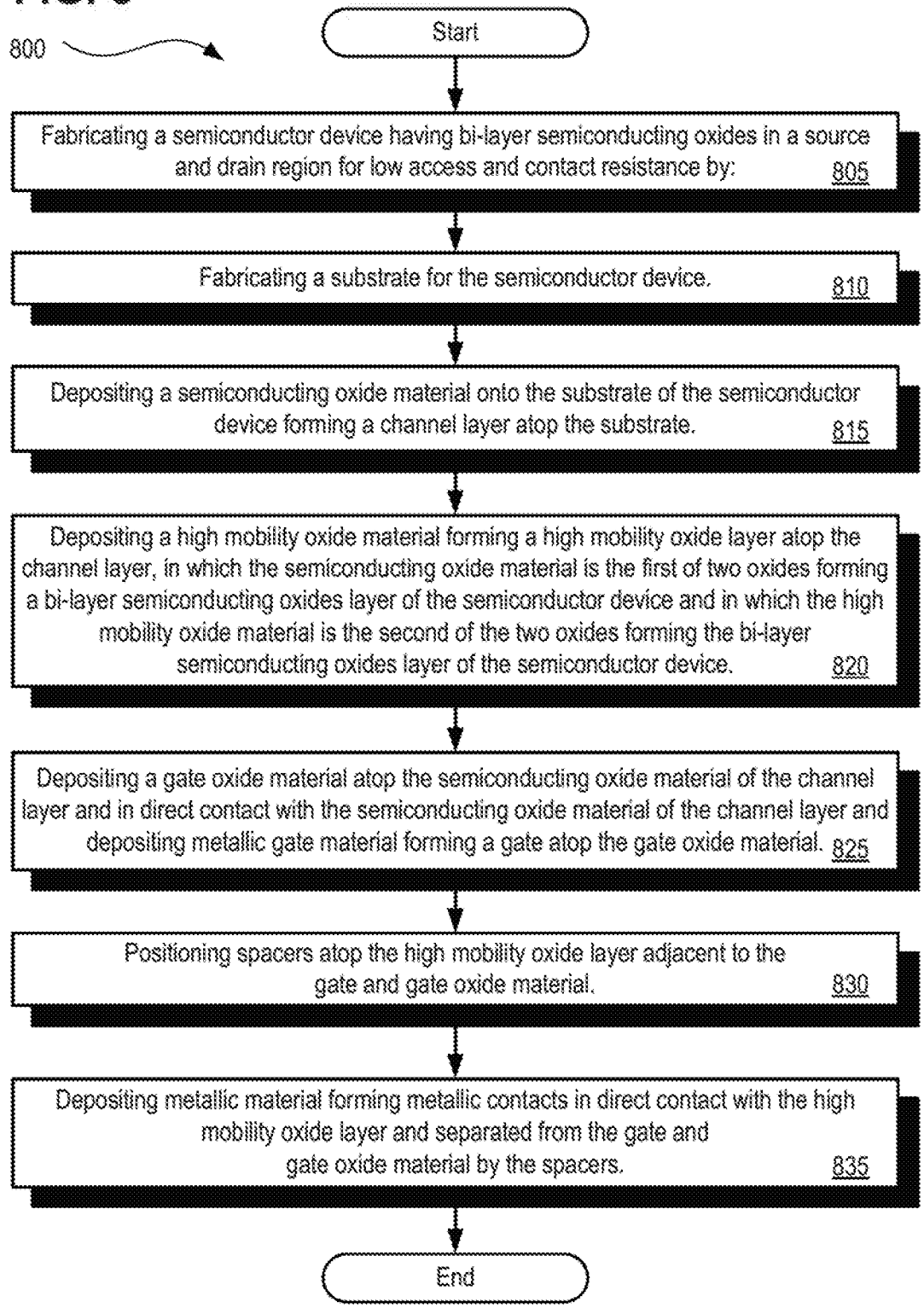

SYSTEMS, METHODS, AND APPARATUSES FOR IMPLEMENTING BI-LAYER SEMICONDUCTING OXIDES IN SOURCE AND DRAIN FOR LOW ACCESS AND CONTACT RESISTANCE OF THIN FILM TRANSISTORS

CROSS-REFERENCE TO RELATED APPLICATION

This patent application is a U.S. National Phase Application under 35 U.S.C. § 371 of International Application No. PCT/US2016/054841, filed Sep. 30, 2016, entitled "SYSTEMS, METHODS, AND APPARATUSES FOR IMPLEMENTING BI-LAYER SEMICONDUCTING OXIDES IN SOURCE AND DRAIN FOR LOW ACCESS AND CONTACT RESISTANCE OF THIN FILM TRANSISTORS," which designates the United States of America, the entire disclosure of which is hereby incorporated by reference in its entirety and for all purposes.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The subject matter described herein relates generally to the field of semiconductor and electronics manufacturing, and more particularly, to systems, methods, and apparatuses for implementing bi-layer semiconducting oxides in a source/drain for low access and contact resistance of thin film transistors.

BACKGROUND

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also correspond to embodiments of the claimed subject matter.

In semiconductor manufacturing oxide semiconductors have applications in memory and back end transistors because they can be deposited at low temperature and do not require a native substrate. Moreover, oxide semiconductors can be integrated vertically (3D) into the semiconductor manufacturing process as thin film transistors.

Unfortunately, oxide semiconductors exhibit a wider band gap than group IV and III-V semiconductors and may therefore suffer from high contact and access resistances.

The present state of the art may therefore benefit from the means for implementing bi-layer semiconducting oxides in a source/drain for low access and contact resistance of thin film transistors as described herein.

BRIEF DESCRIPTION OF THE DRAWINGS

Embodiments are illustrated by way of example, and not by way of limitation, and will be more fully understood with reference to the following detailed description when considered in connection with the figures in which:

FIGS. 3A, 3B, and 3C depict exemplary process flows for building bi-layer semiconducting oxides in the Source/Drain contacts region for low access and improved contact resistance in accordance with described embodiments;

FIGS. 4A, 4B, 4C, and 4D depict exemplary process flows for building bi-layer semiconducting oxides in the Source/Drain contacts region for low access and improved contact resistance in accordance with described embodiments;

FIG. 8 is a flow diagram illustrating a method for implementing bi-layer semiconducting oxides in a source/drain for low access and contact resistance of thin film transistors in accordance with described embodiments.

DETAILED DESCRIPTION

Figure 1:
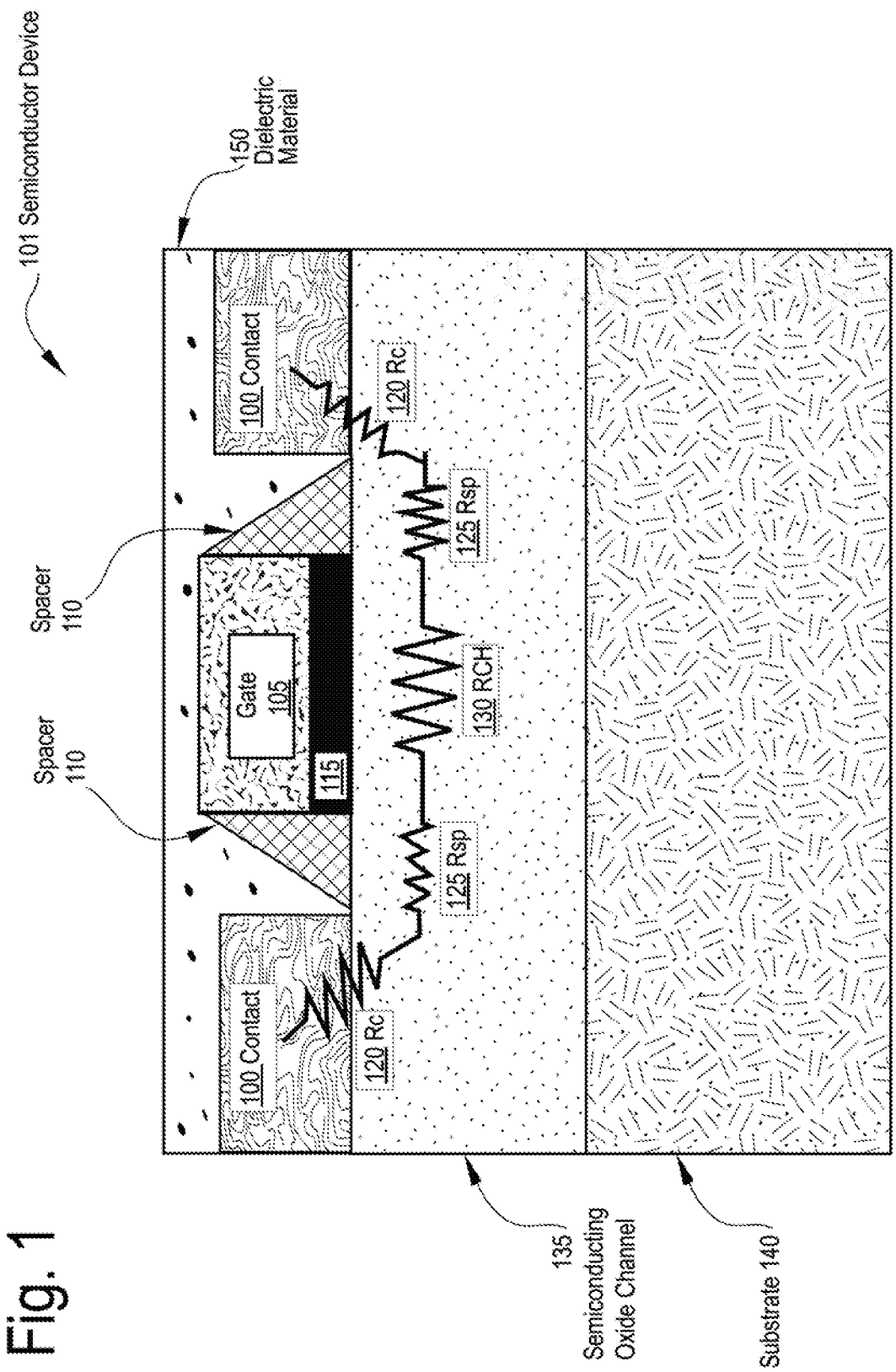
FIG. 1 depicts an exemplary semiconductor device in accordance with which embodiments may operate.

Described herein are systems, methods, and apparatuses for implementing bi-layer semiconducting oxides in a source/drain for low access and contact resistance of thin film transistors. For instance, there is disclosed in accordance with one embodiment a semiconductor device having therein a substrate; a bi-layer oxides layer formed from a first oxide material and a second oxide material, the first oxide material comprising a semiconducting oxide material and having different material properties from the second oxide material comprising a high mobility oxide material; a channel layer formed atop the substrate, the channel layer formed from semiconducting oxide material of the bi-layer oxides layer; a high mobility oxide layer formed atop the channel layer, the high conductivity oxide layer formed from the high mobility oxide material of the bi-layer oxides layer; metallic contacts formed atop the high mobility oxide layer; a gate and a gate oxide material formed atop the high mobility oxide layer, the gate oxide material being in direct contact with the high mobility oxide layer; and spacers separating the metallic contacts from the gate and gate oxide material.

In the following description, numerous specific details are set forth such as examples of specific systems, languages, components, etc., in order to provide a thorough understanding of the various embodiments. It will be apparent, however, to one skilled in the art that these specific details need not be employed to practice the embodiments disclosed herein. In other instances, well known materials or methods have not been described in detail in order to avoid unnecessarily obscuring the disclosed embodiments.

In addition to various hardware components depicted in the figures and described herein, embodiments further include various operations which are described below. The operations described in accordance with such embodiments may be performed by hardware components or may be embodied in machine-executable instructions, which may be used to cause a general-purpose or special-purpose processor programmed with the instructions to perform the operations. Alternatively, the operations may be performed by a combination of hardware and software.

Any of the disclosed embodiments may be used alone or together with one another in any combination. Although various embodiments may have been partially motivated by deficiencies with conventional techniques and approaches, some of which are described or alluded to within the specification, the embodiments need not necessarily address or solve any of these deficiencies, but rather, may address only some of the deficiencies, address none of the deficiencies, or be directed toward different deficiencies and problems which are not directly discussed.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1 depicts an exemplary semiconductor device 101 in accordance with which embodiments may operate.

In particular, there is depicted a semiconductor device 101 having therein a substrate 140, a semiconducting oxide material 135 or a channel 135 layer, and a dielectric material 150 fully encompassing the contacts 100 which are electrically connected symmetrically. For instance, the channel layer may be formed from a crystalline semiconducting oxide material or an amorphous semiconducting oxide material, sometimes referred to as an Amorphous Oxide Semiconductor (AOS) material.

As can be observed, there is contact resistance Rc 120 leading as well as spreading resistance Rsp 125 and channel resistance RCH 130.

Contact resistance 120 Rc is the resistance between the metal of the contact 100 and the semiconducting oxide channel 135 interface. Spreading resistance Rsp 125 is further depicted underneath the spacers 110. Lastly, there is the channel resistance RCH 130 which is the resistance being modulated by the gate 105. The resistances are symmetric to each side between the source and drain contacts 100.

Also depicted are the spacers 110 surrounding the gate 105 which rests upon the gate oxide material 115.

The depicted semiconductor device 101 is representative of a large band gap amorphous oxide semiconductor resulting in both a high resistance under the spacer 110 and a high contact resistance Rc 120 to the metal and consequently a large access resistance.

Figure 2:
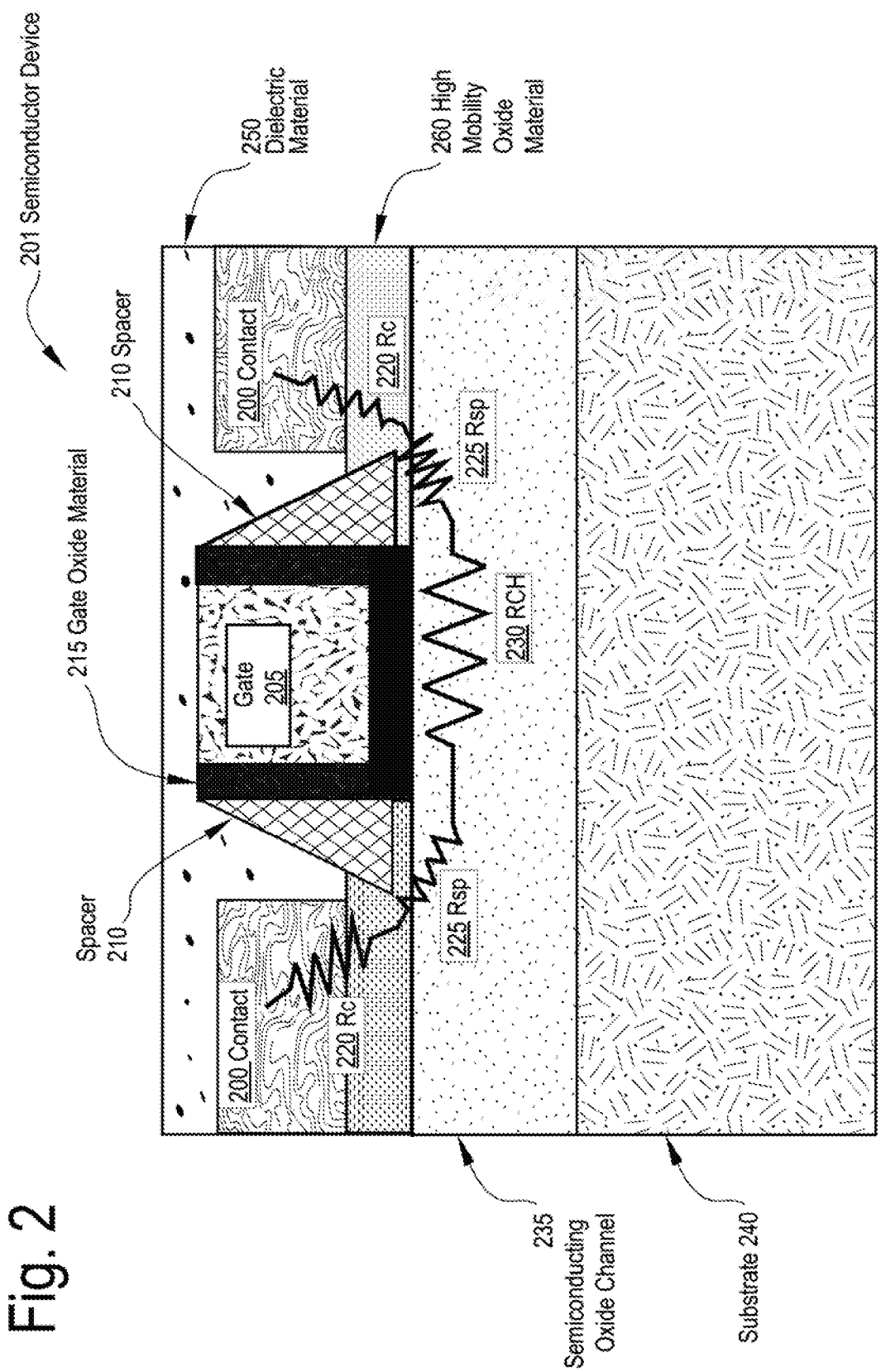
FIG. 2 depicts another exemplary semiconductor device in accordance with which embodiments may operate.

FIG. 2 depicts another exemplary semiconductor device 201 in accordance with which embodiments may operate.

As depicted, there is a substrate 240 upon which the semiconducting oxide channel 235 material resides. Further depicted is the dielectric material 250 fully encompassing the contacts 200 which are electrically connected symmetrically through a high mobility oxide material 260. The high mobility oxide material may be, but is not necessarily an amorphous oxide material. Rather, the high mobility oxide material is chosen for its high mobility characteristics.

As can be observed, there is further depicted the reduced contact resistance Rc 220 leading to spreading resistance Rsp 225 and channel resistance RCH 230. Surrounding the gate 205 is a gate oxide material 235 which fully surrounds the gate rather than being present only beneath the gate, with the spacers surrounding the gate oxide material 215 and leaving a small gap of high mobility oxide material 260 between the bottom of the spacers 210 and the semiconducting oxide channel 235 material.

Because many types of oxide semiconductors exist with a large range of mobility, contact resistance, and carrier density, it is advantageous to use an oxide semiconductor material as a channel which exhibits optimal gating properties, while using a second oxide semiconductor in the source and drain area to benefit from the higher mobility and carrier density and therefore reduce the access resistance to the thin film transistor.

Moreover, when contacting a wide band gap amorphous oxide directly with a metal a large Schottky barrier is exhibited which prevents low access resistance. A Schottky barrier is the potential energy barrier for electrons formed at a metal to semiconductor junction, the value of which depends on the combination of metal and semiconductor materials chosen.

Channel materials 235 may be therefore selected for optimum gating and low off-state leakage properties while introducing a second semiconducting oxide depicted here as the high mobility oxide material 260 provides the ability to select for properties that would have a lowest access resistance. Experimental Indium-Gallium-Zinc Oxide (IGZO) thin film transistors have been fabricated with excellent gating characteristics. However, such IGZO thin film transistors exhibit problematically large contact resistances due to the wide band gap of the IGZO and the low carrier density in the source and drain.

The semiconductor device 201 depicted here combines the best channel properties with a low resistance contact Rc 220 by using the second semiconducting oxide, shown here as the high mobility oxide material 260 or alternatively a high mobility amorphous oxide material deposited atop the semiconducting oxide channel 235 material.

The high mobility oxide material when combined with the semiconducting oxide channel 235 material therefore forms the bi-layer semiconducting oxides in the Source/Drain region for low access and improved contact resistance of thin film resistors as described herein.

By inserting the high mobility oxide material under the contacts and spacer there is exhibited a lower resistance under the spacer and a lower metal contact resistance Rc 220 in the source/drain due to lower Eg and higher μeff and further in which the materials maintain a low leakage and exhibit improved gating properties of wide BG semiconducting oxide resulting in a much lower total access resistance Thin Film Transistor (TFT).

Such exemplary high mobility oxide materials 260 may include any of, by way of example, $SbO2$, $SnO2$, $InO2$, ITO, TiO, ZO, high indium content IGZO, etc.

The high mobility oxide material 260 (or alternatively a high mobility amorphous oxide material) and the semiconducting oxide channel material selected for the bi-layers of the channel of transistors permit the gate 205 to turn on and off the semiconducting oxide channel 235 with reduced total access resistance.

The channel resistance RCH 230 will optimally be the primary resistance encountered within a semiconductor device 201. However, for reasons which are unavoidable the semiconducting oxide channel 235 must be connected to the external load using contacts 200 and consequently, there is also contact resistance Rc 220 which is not controllable by the gate 205.

Because the gate 205 is to modulate the resistance of the semiconductor device 201 it is desirable for the contact resistance Rc 220 to be as low as possible.

Using only amorphous oxide materials as is depicted at the semiconductor device 101 of FIG. 1 there will result large band gaps resulting in increased resistance.

A band gap is an energy range of the semiconductor material where no electron states may exist. The band gap generally refers to the energy differences (in electron volts) between the top of the valence band and the bottom of the conduction band of the semiconductor material. If the valence band is completely full and the conduction band is completely empty, then electrons cannot move through the material; however, if some electrons transfer from the valence band to the conduction band, then current may flow. Therefore, the band gap is an important factor determining the electrical conductivity of the materials selected. Substances with large band gaps are generally insulators, those with smaller band gaps are semiconductors, while conductors either have very small band gaps or none, because the valence and conduction bands overlap.

Material selection and optimization may contribute to reduced contact resistance Rc 220 which is important as the contact resistance Rc 220 is not controlled by the gate and therefore presents an undesirable anomaly in the device 201. While contact resistance Rc 220 cannot be eliminated wholly, by reducing the contact resistance Rc 220 as much as possible, the maximum modulation will therefore originate from the gate's 205 direct control.

Amorphous oxide materials such as those which may optionally be utilized to form the depicted semiconducting oxide channel 235 material exhibit large band gaps which make it more difficult to make good contact with the material. Therefore, a secondary material is selected forming the second component of the bi-layer semiconducting oxides which have both a smaller band gap and also a higher mobility, such as with the high mobility oxide material 260.

The mobility of the material characterizes how fast carriers or electrons move through the particular material. Therefore, a high mobility material implies also that the material exhibits a high conductivity.

Therefore, a high mobility material is utilized in the source and drain contact 200 regions thereby reducing the contact resistance Rc 220, hence the depiction of the high mobility oxide material 260 being sandwiched in-between the source and drain contacts 200 and the semiconducting oxide channel 235 material below.

Using the bi-layer semiconducting oxides formed from both the semiconducting oxide channel 235 material and the high mobility oxide material 260 drastically reduces problematic high contact resistances Rc observed in prior solutions between the contacts 200 and the semiconducting oxide channel 235 region.

The contact resistance Rc and the spreading resistance Rsp exhibited at the semiconductor device 101 of FIG. 1 are problematically high and are not modulated by the gate 105 of the semiconductor device 101 at FIG. 1. Through the use of a higher mobility oxide material (amorphous or crystalline) beneath the source and drain contact 200 regions a potentially lower band gap is provided than with the material forming the semiconducting oxide channel 235 region where the channel resistance RCH 230 is observed. Consequently, the contact resistance Rc 220 is lowered and the spreading resistance Rsp 225 below the spacer 210 region is also lowered due to the greater conductivity of the material.

Because amorphous oxide materials are new to the marketplace they have not yet been successfully integrated into thin film transistors in the manner which is described herein. Consequently, alternative solutions were pursued to reduce the contact resistance Rc 220 encountered in such devices. However, such prior methodologies have not been successful in reducing the contact resistance Rc 220 to the extent observed in the bi-layer semiconducting oxides in the Source/Drain contacts 200 region for low access and improved contact resistance Rc 220 through the combination of the high mobility oxide material 260 in conjunction with the semiconducting oxide channel material 235.

Figure 3B:
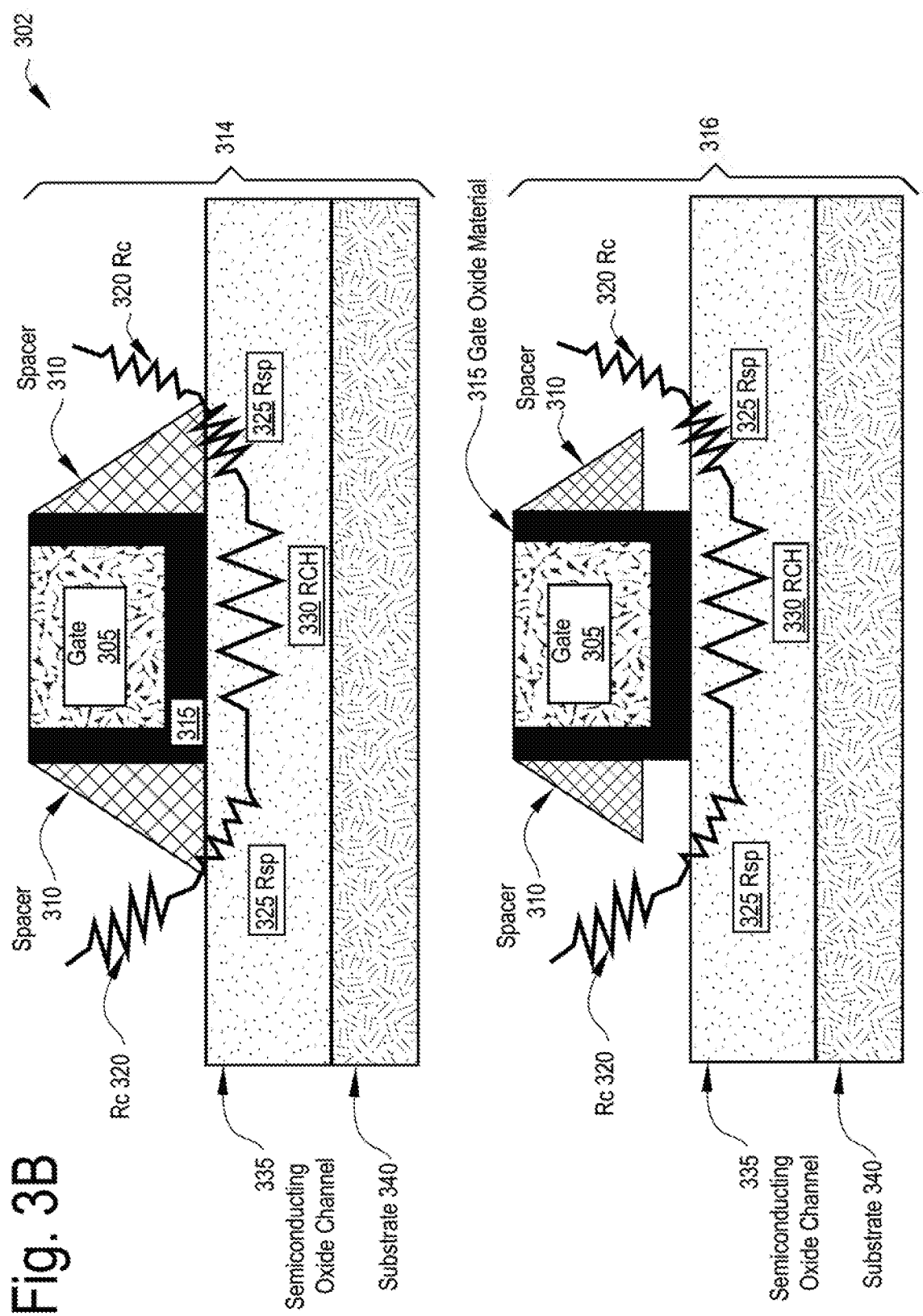
Figure 3C:
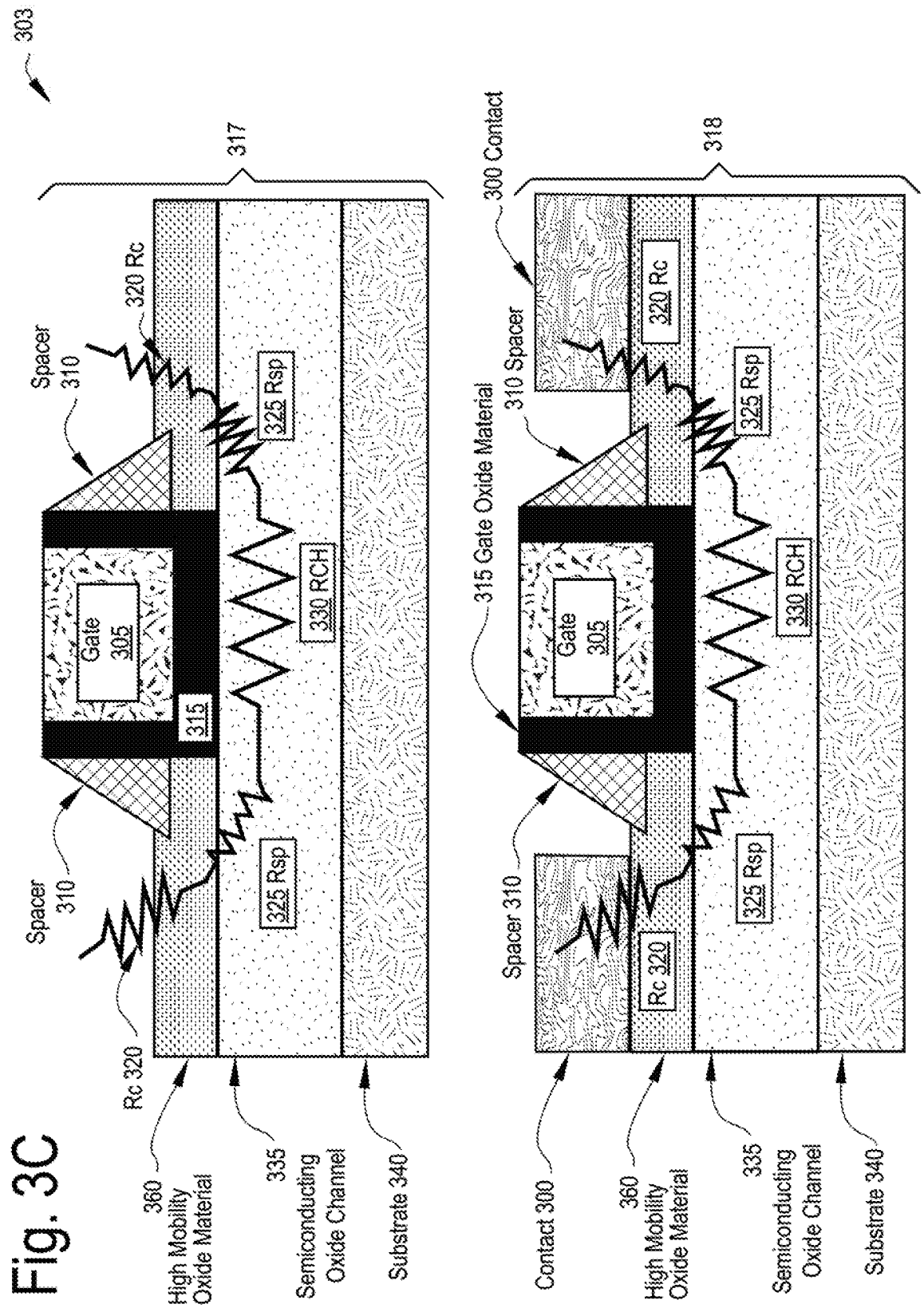

FIGS. 3A, 3B, and 3C depict exemplary process flows (301, 302, and 303) for building bi-layer semiconducting oxides in the Source/Drain contacts region for low access and improved contact resistance in accordance with described embodiments.

In particular, at operation 311 of FIG. 3A, a substrate 340 is fabricated. For instance, either silicon is fabricated or silicon layers upon silicon layers are formed as part of, for example, a back end interconnect region of a semiconductor device with the substrate being formed from any of a wide variety of available substrate materials such as silicon, silicon dioxide, aluminum oxide, sapphire, germanium, gallium arsenide (GaAs), an alloy of silicon and germanium, indium phosphide (InP), etc.

At operation 312, the semiconducting oxide channel 335 is formed upon the substrate 340 through which channel resistance RCH 330 will be modulated by the gate 305 of the fully formed and operational transistor. In accordance with certain embodiments, operation 312 includes a sputter process to deposit the semiconducting oxide channel 335 material or to sputter an amorphous oxide channel material (AOS channel) onto the substrate 340.

Contact resistance Rc 320 and spreading resistance Rsp 325 are depicted but will be reduced through the use of the formed bi-layer semiconducting oxides for the source and drain contact regions.

It is preferable that the channel material forming the semiconducting oxide channel 335 layer exhibit reasonable mobility, though not necessarily as high as the second material of the bi-layer amorphous oxides layer. Importantly, however, the channel material should have a large band gap so that the semiconducting oxide channel 335 exhibits low leakage. The high band gap amorphous layer is sputtered onto the previously formed substrate and is then patterned such that the gate oxide material 315 may be deposited directly onto the semiconducting oxide channel 335 material.

At operation 313 the gate oxide material 315 is deposited onto the patterned semiconducting oxide channel 335 layer thus forming the gate oxide material 315 surrounding the gate 305.

At operation 314 of FIG. 3B, the spaces 310 surrounding the gate 305 and gate oxide material are created as shown. The spacers 310 form an area of separation from the gate such that when the contact material is deposited it does not land on or make direct contact with the gate which would result in a short.

At operation 316, the spacers 310 are undercut or etched away such that the second layer material of the bi-layer semiconducting oxides may be deposited and reside beneath the spacer atop the semiconducting oxide channel 335 material but not below the gate oxide material 315 which is in direct contact with the semiconducting oxide channel 335 material. In alternative embodiments, a top portion of the semiconducting oxide channel 335 material may be undercut or etched away to form a space beneath the spacers 310 within which the second layer material of the bi-layer semiconducting oxides may be deposited and as before, reside beneath the spacer atop the semiconducting oxide channel 335 material but not below the gate oxide material 315 such that the gate oxide material 315 remains in direct contact with the semiconducting oxide channel 335 material.

At operation 317 of FIG. 3C, the high mobility oxide material 360 forming the second layer material of the bi-layer semiconducting oxides is deposited atop the semiconducting oxide channel material 335 thus forming the bi-layer semiconductor oxide in which the high mobility oxide material 360 is beneath the spacers 310 and atop the semiconducting oxide channel material 335 but is not between the gate oxide material 315 and the semiconducting oxide channel material 335.

At operation 318 the contacts 300 are then opened by depositing the chosen contact metal of which the contacts 300 at the source and drain regions are to be formed. Notably, the contacts 300 are in direct contact with the high mobility oxide material 360 but do not contact the lower mobility but higher conductivity semiconducting oxide channel 335 material, thus providing for both low access and decreased contact resistances Rc 320 between the contacts metal and the bi-layer amorphous oxides layer.

According to certain embodiments, an interlayer dialectic layer or ILD layer is deposited into which openings are formed into which the contact 300 material is deposited in order to form the contacts 300.

A variety of oxide materials or amorphous oxide materials which exhibit high mobility characteristics may be utilized to form the high mobility oxide material of the bi-layer oxides layer whether they are crystalline or amorphous. For instance, such materials, despite their conventional lack of use in CMOS devices may nevertheless be incorporated such as Tin Oxides, Indium Tin Oxides, Zinc Oxides, high Indium content oxides (e.g., $SbO_2$, $SnO_2$, $InO_2$, ITO, TiO, ZO, high indium content IGZO, etc.).

According to an alternative embodiment, when the contacts 300 are opened in the contact region a portion of the semiconducting oxide channel 335 material is next etched away forming a space upon which to deposit the high mobility oxide material 360. According to particular embodiments, the high mobility oxide material 360 is then epitaxially grown atop the semiconducting oxide channel 335 material, thus growing the high mobility oxide material 360 on top of the etched away surface of the semiconducting oxide channel 335 layer.

For instance, in the contact region, after depositing the metal forming the contacts 300 the etching of the previously formed semiconducting oxide channel 335 material permits a space to be opened beneath the spacers 310 within which the epitaxial growth of the high mobility oxide material may form including within the space opened beneath the spacers 310 thus permitting the bi-layer oxide build up of the high mobility oxide material after the spacers have been placed separating the gate and gate oxide material from the contacts 300.

FIGS. 4A, 4B, 4C, and 4D depict exemplary process flows (401, 402, 403, and 404) for building bi-layer semiconducting oxides in the Source/Drain contacts region for low access and improved contact resistance in accordance with described embodiments.

For instance, in yet another alternative, the semiconducting oxide channel material 435 is sputtered upon the substrate 440 and then the high mobility oxide material 460 is additionally deposited forming the bi-layer oxides material prior to placement of the gate oxide material 415, the gate, and the spacers 410. This will result in the bi-layer having been formed but for which there now requires an etching process to open a space into the top layer of the bi-layer oxide materials such that the etching may remove the high mobility amorphous oxide material 460 in the gate region such that the gate oxide material and the gate 405 may then be deposited onto a patterned surfaced of the semiconducting oxide channel material having been exposed by the etching removal of the high mobility oxide material 460 in the gate region. The spacers 410 are then placed surrounding the gate oxide material and atop the high mobility oxide material surrounding the newly deposited gate oxide material and gate after which the contacts 400 may be deposited onto a patterned surface of the high mobility oxide material 460 in the contacts region.

In yet another alternative embodiment, the substrate is formed and both the semiconducting oxide channel material 435 and the high mobility oxide material 460 are deposited and patterned together, after which etching will reveal a defined left and right edge where the gate oxide material and gate may be deposited, such that the gate oxide material 415 and the gate 405 metal may be deposited, permitting the gate oxide material 415 to directly be in contact with the semiconducting oxide channel material 435. Subsequently, the spacers 410 are placed which will contact the sides of the gate oxide material 415 but be on top of the high mobility oxide material 460 layer which was deposited along with the semiconducting oxide channel layer 435. The spacers will be atop the high mobility oxide material because the patterning and etch defined an edge and recess into which the gate oxide material makes contact to the semiconducting oxide channel layer but leaves the high mobility oxide material remaining in the spacer region where the spacer is placed after the gate materials are deposited. With the spacers 410 in place the contact metals may then be deposited as usual without the risk of forming a short to the gate.

The exemplary process flows (401, 402, 403, and 404) depict such a process, beginning with flow 401 at FIG. 4A in which the substrate 440 is deposited at operation 411.

At operation 412, the semiconducting oxide channel 435 material is deposited or sputtered upon the substrate forming the first of the two bi-layer oxide materials through which the channel resistance RCH 430 will be modulated by the gate of the fully formed transistor which will thus exhibit reduced contact resistance Rc 420 and reduced spreading resistance Rsp 425.

At operation 413 the second of the two bi-layer oxide materials are deposited with the placement of the high mobility oxide material 460 atop the semiconducting oxide channel material 435.

Figure 4B:
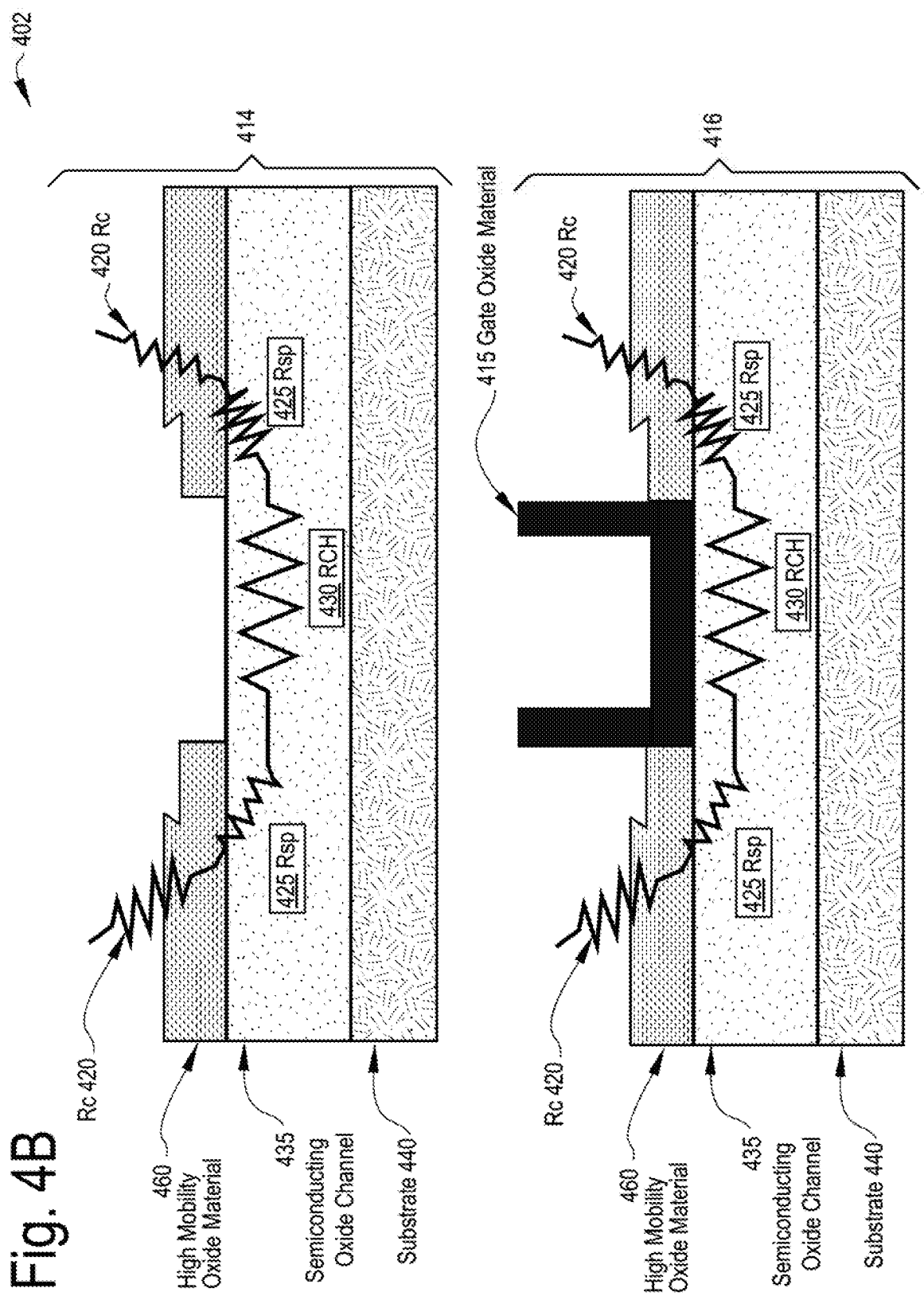
Figure 4C:
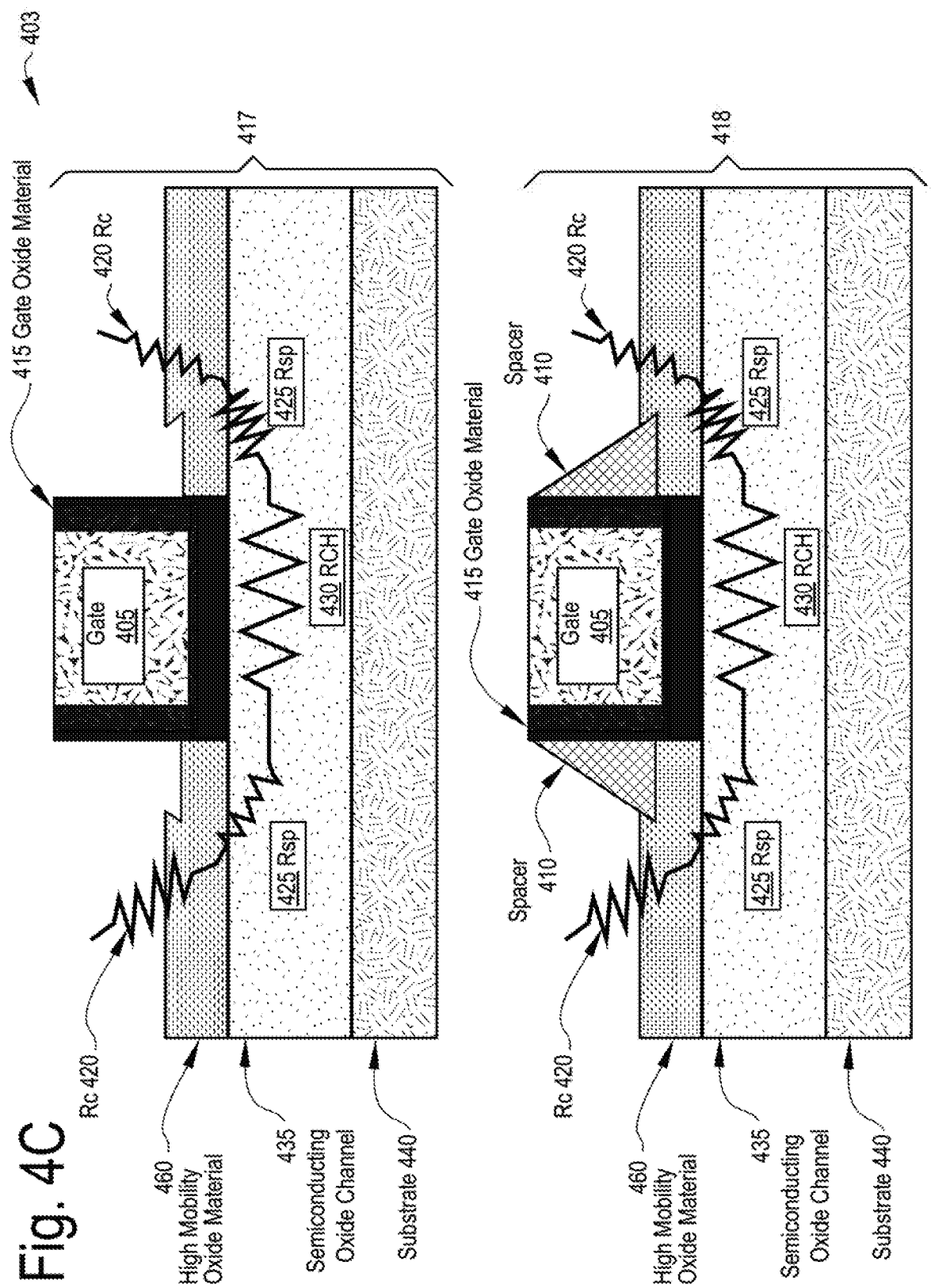

Turning to flow 402 at FIG. 4B, operation 414 depicts the patterning and etch of the high mobility oxide layer 460 which results in a total removal of the high mobility oxide layer 460 in the gate region where the gate will be formed and a partial removal or thinning of the high mobility oxide layer 460 in the spacer region next to the gate region where the spacers will be placed, thus permitting the gate oxide material, once formed, to make direct contact with the semiconducting oxide channel 435 material while yet permitting the spacers to separate the gate from the contacts and still be removed from the OAS channel 435 material and residing atop the high mobility oxide material 460.

At operation 416 it may be thus observed that the gate oxide material 415 is deposited upon the patterned semiconducting oxide channel 435 material thus making direct contact between the gate oxide material 415 and the semiconducting oxide channel 435 which was revealed or exposed by the complete removal etching of the high mobility oxide material 460 which was previously deposited atop the semiconducting oxide channel material 435.

Turning to flow 403 at FIG. 4D, operation 417 depicts the depositing of the gate 405 material into the fully etched region of the high mobility oxide material 460 permitting the gate and gate oxide material to be in contact with the semiconducting oxide channel 435 material.

At operation 418 it may be observed that the spacers are now formed or placed atop the high mobility oxide layer 460 which was thinned or partially etched but not fully removed at the spacer region. Consequently, the spacers separate the now formed gate 405 from the soon to be formed contacts thus preventing a short while also permitting the spacers to reside atop the high mobility oxide material 460 without having to undercut or etch the spacers.

Turning to flow 403 at FIG. 4D, operation 419 depicts the contact 400 metal now deposited atop the high mobility oxide material 460 without being permitted to touch or short to the gate due to the prior placement of the spacers 410.

At operation 421 a dielectric material 450 is then overmolded or filled to protect the device.

In alternative embodiments the dielectric material 450 may be overmolded prior to placement of the contacts 400 in which case openings are formed into the dielectric material 450 into which the contacts are then deposited.

Figure 5:
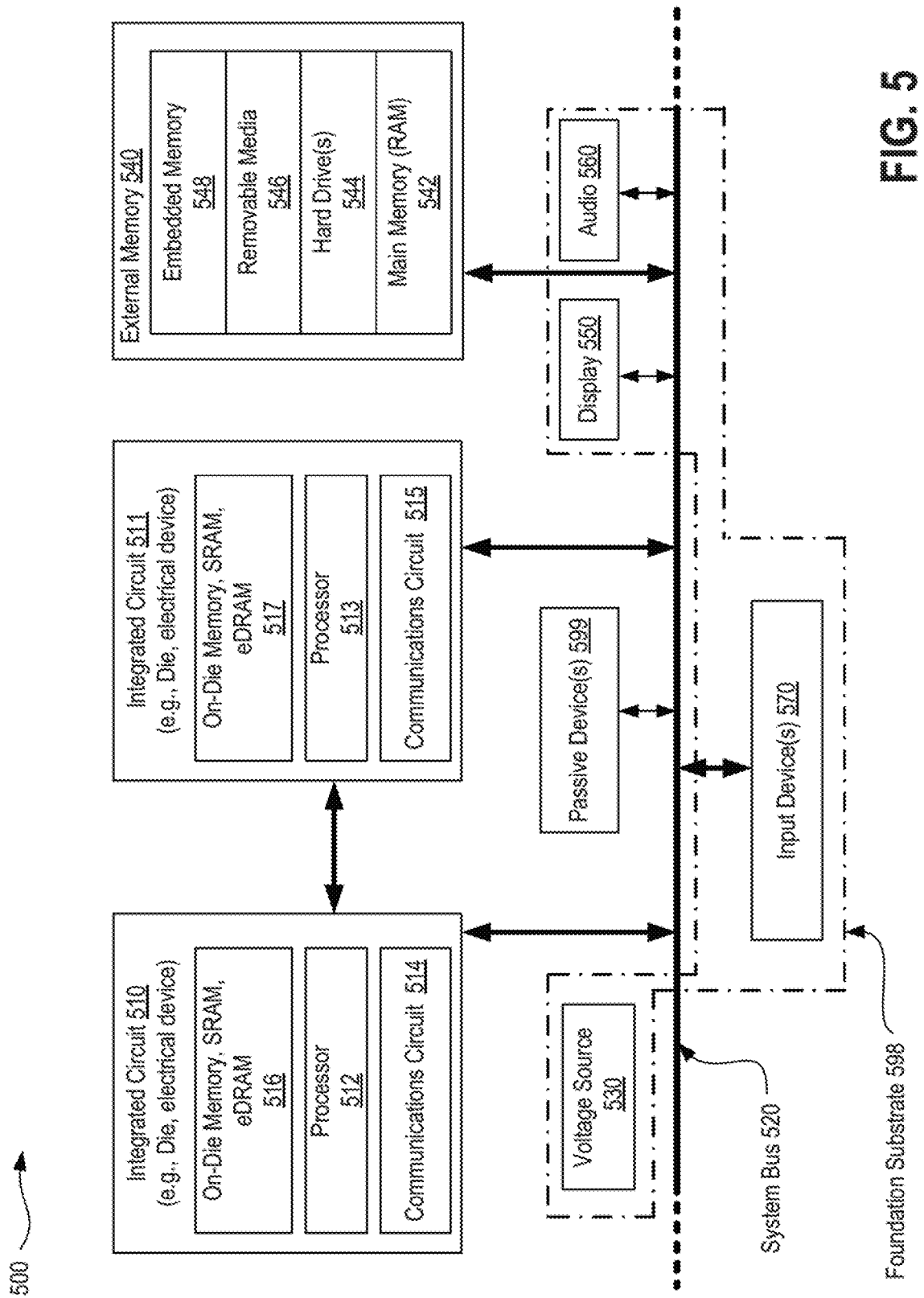
FIG. 5 is a schematic of a computer system in accordance with described embodiments.

Regardless of how formed, the material properties or characteristics of the channel material are selected so as to result in a high band gap with intermediate mobility at the semiconducting oxide channel 435 layer which should correspond therefore to a low leakage material. A large band gap but poor mobility at the semiconducting oxide channel 435 layer is not acceptable. The high mobility layer 460 forming the second layer of the bi-layer oxides material should have high mobility but permit for easier contact and therefore reduced contact resistance Rc 420 between the metal of the contact 400 and the high mobility oxide material 460. The poor conductivity of the high mobility oxide material is compensated for by the improved contact FIG. 5 is a schematic of a computer system 500 in accordance with described embodiments. The computer system 500 (also referred to as the electronic system 500) as depicted can embody means for implementing bi-layer semiconducting oxides in a source/drain for low access and contact resistance of thin film transistors, according to any of the several disclosed embodiments and their equivalents as set forth in this disclosure. The computer system 500 may be a mobile device such as a net-book computer. The computer system 500 may be a mobile device such as a wireless smart phone or tablet. The computer system 500 may be a desktop computer. The computer system 500 may be a hand-held reader. The computer system 500 may be a server system. The computer system 500 may be a supercomputer or high-performance computing system.

In accordance with one embodiment, the electronic system 500 is a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In some embodiments, the voltage source 530 supplies current to the integrated circuit 510 through the system bus 520.

Such an integrated circuit 510 is electrically coupled to the system bus 520 and includes any circuit, or combination of circuits according to an embodiment. In an embodiment, the integrated circuit 510 includes a processor 512 that can be of any type. As used herein, the processor 512 may mean any type of circuit such as, but not limited to, a microprocessor, a microcontroller, a graphics processor, a digital signal processor, or another processor. In an embodiment, the processor 512 includes, or is coupled with, electrical devices having gradient encapsulant protection, as disclosed herein.

In accordance with one embodiment, SRAM embodiments are found in memory caches of the processor. Other types of circuits that can be included in the integrated circuit 510 are a custom circuit or an application-specific integrated circuit (ASIC), such as a communications circuit 514 for use in wireless devices such as cellular telephones, smart phones, pagers, portable computers, two-way radios, and similar electronic systems, or a communications circuit for servers. In an embodiment, the integrated circuit 510 includes on-die memory 516 such as static random-access memory (SRAM). In an embodiment, the integrated circuit 510 includes embedded on-die memory 516 such as embedded dynamic random-access memory (eDRAM).

In accordance with one embodiment, the integrated circuit 510 is complemented with a subsequent integrated circuit 511. Useful embodiments include a dual processor 513 and a dual communications circuit 515 and dual on-die memory 517 such as SRAM. In accordance with one embodiment, the dual integrated circuit 510 includes embedded on-die memory 517 such as eDRAM.

In one embodiment, the electronic system 500 also includes an external memory 540 that in turn may include one or more memory elements suitable to the particular application, such as a main memory 542 in the form of RAM, one or more hard drives 544, and/or one or more drives that handle removable media 546, such as diskettes, compact disks (CDs), digital variable disks (DVDs), flash memory drives, and other removable media known in the art. The external memory 540 may also be embedded memory 548 such as the first die in a die stack, according to an embodiment.

In accordance with one embodiment, the electronic system 500 also includes a display device 550 and an audio output 560. In one embodiment, the electronic system 500 includes an input device 570 such as a controller that may be a keyboard, mouse, trackball, game controller, microphone, voice-recognition device, or any other input device that inputs information into the electronic system 500. In an embodiment, an input device 570 is a camera. In an embodiment, an input device 570 is a digital sound recorder. In an embodiment, an input device 570 is a camera and a digital sound recorder.

As shown herein, the integrated circuit 510 can be implemented in a number of different embodiments, including a package substrate or a semiconductor package having therein means for implementing bi-layer semiconducting oxides in a source/drain for low access and contact resistance of thin film transistors, according to any of the several disclosed embodiments and their equivalents, an electronic system, a computer system, one or more methods of fabricating an integrated circuit, and one or more methods of fabricating an electronic assembly that includes a package substrate or a semiconductor package having therein means for implementing bi-layer semiconducting oxides in a source/drain for low access and contact resistance of thin film transistors, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates and semiconductor packages having means for implementing bi-layer semiconducting oxides in a source/drain for low access and contact resistance of thin film transistor embodiments and their equivalents. A foundation substrate 598 may be included, as represented by the dashed line of FIG. 5. Passive devices 599 may also be included, as is also depicted in FIG. 5.

Figure 6:
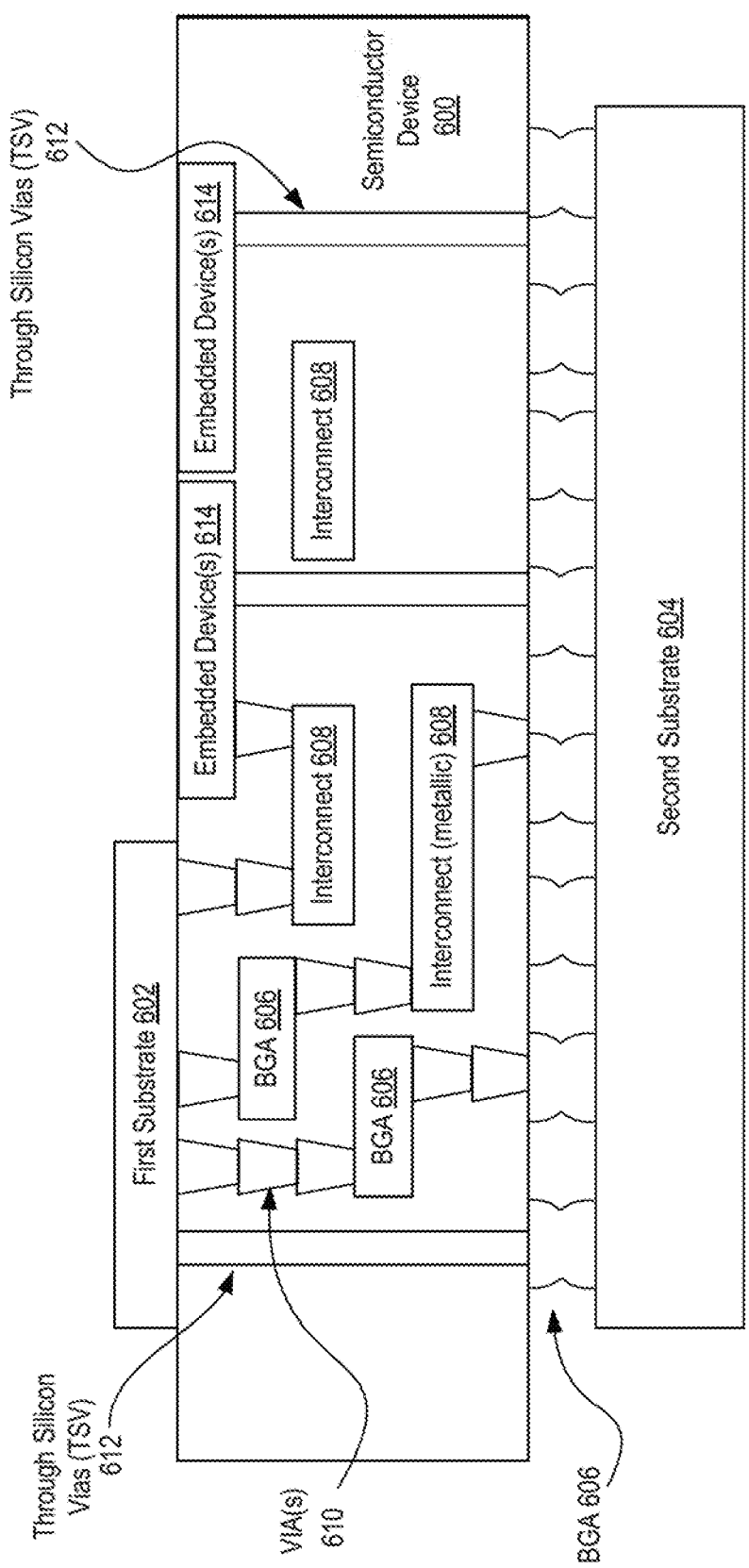
FIG. 6 illustrates an interposer that includes one or more described embodiments.

FIG. 6 illustrates an interposer 600 that includes one or more described embodiments. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with described embodiments, apparatuses or processes disclosed herein may be used in the fabrication of interposer 600.

Figure 7:
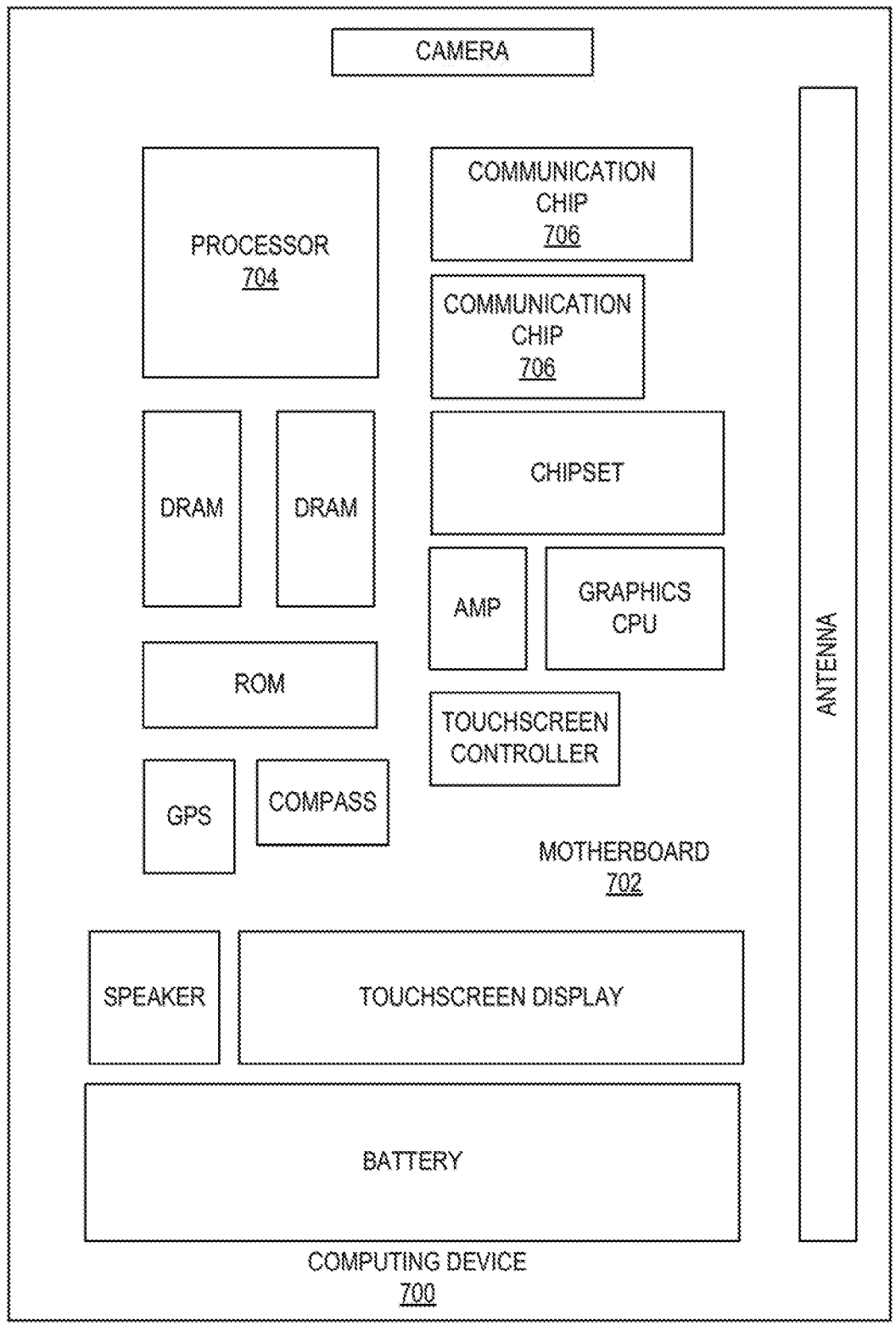
FIG. 7 illustrates a computing device in accordance with one implementation of the invention.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip includes one or more devices, such as MOS-FET transistors built in accordance with implementations of the invention.

In further implementations, another component housed within the computing device 700 may contain an integrated circuit die that includes one or more devices, such as MOS-FET transistors built in accordance with implementations of the invention.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

FIG. 8 is a flow diagram illustrating a method 800 for implementing bi-layer semiconducting oxides in a source/drain for low access and contact resistance of thin film transistors in accordance with described embodiments. Some of the blocks and/or operations listed below are optional in accordance with certain embodiments. The numbering of the blocks presented is for the sake of clarity and is not intended to prescribe an order of operations in which the various blocks must occur. Additionally, operations from flow 800 may be utilized in a variety of combinations.

At block 805 the method 800 for implementing bi-layer semiconducting oxides in a source/drain for low access and contact resistance of thin film transistors begins with fabricating a semiconductor device having bi-layer semiconducting oxides in a source/drain region for low access and contact resistance by the following operations:

At block 810 the method includes fabricating a substrate for the semiconductor device.

At block 815 the method includes depositing a semiconducting oxide material onto the substrate of the semiconductor device forming a channel layer atop the substrate.

At block 820 the method includes depositing a high mobility oxide material forming a high mobility oxide layer atop the channel layer, in which the semiconducting oxide channel material is the first of two oxides forming a bi-layer semiconducting oxides layer of the semiconductor device and in which the high mobility oxide material is the second of the two oxides forming the bi-layer semiconducting oxides layer of the semiconductor device.

At block 825 the method includes depositing a gate oxide material atop the semiconducting oxide material of the channel layer and in direct contact with the semiconducting oxide material of the channel layer and depositing metallic gate material forming a gate atop the gate oxide material.

At block 830 the method includes positioning spacers atop the high mobility oxide layer adjacent to the gate and gate oxide material.

At block 835 the method includes depositing metallic material forming metallic contacts in direct contact with the high mobility oxide layer and separated from the gate and gate oxide material by the spacers.

While the subject matter disclosed herein has been described by way of example and in terms of the specific embodiments, it is to be understood that the claimed embodiments are not limited to the explicitly enumerated embodiments disclosed. To the contrary, the disclosure is intended to cover various modifications and similar arrangements as would be apparent to those skilled in the art. Therefore, the scope of the appended claims should be accorded the broadest interpretation so as to encompass all such modifications and similar arrangements. It is to be understood that the above description is intended to be illustrative, and not restrictive. Many other embodiments will be apparent to those of skill in the art upon reading and understanding the above description. The scope of the disclosed subject matter is therefore to be determined in reference to the appended claims, along with the full scope of equivalents to which such claims are entitled.

It is therefore in accordance with the described embodiments, that:

According to one embodiment there is a semiconductor device, the semiconductor device having therein: a substrate; a bi-layer oxides layer formed from a first oxide material and a second oxide material, the first oxide material including a semiconducting oxide material and having different material properties from the second oxide material including a high mobility oxide material; a channel layer formed atop the substrate, the channel layer formed from the semiconducting oxide material of the bi-layer oxides layer; a high mobility oxide layer formed atop the channel layer, the high conductivity oxide layer formed from the high mobility oxide material of the bi-layer oxides layer; metallic contacts formed atop the high mobility oxide layer; a gate and a gate oxide material formed atop the semiconducting oxide material of the channel layer, the gate oxide material being in direct contact with the semiconducting oxide material of the channel layer; and spacers separating the metallic contacts from the gate and gate oxide material.

According to another embodiment, the semiconductor device further includes an interlayer dielectric (ILD) material covering at least the gate.

According to another embodiment of the semiconductor device, the interlayer dielectric (ILD) includes an oxide material.

According to another embodiment of the semiconductor device, the interlayer dielectric is deposited onto the semiconductor device covering the gate and covering the spacers and covering a contacts region where the metallic contacts are to be placed atop the high mobility oxide layer; in which holes are opened into the interlayer dielectric (ILD) at the contacts region where the metallic contacts are to be placed; and in which the metallic contacts formed atop the high mobility oxide layer are formed by depositing metallic material forming the metallic contacts into the holes opened into the interlayer dielectric material at the contacts region of the semiconductor device.

According to another embodiment of the semiconductor device, the high mobility oxide layer includes a high conductivity oxide material.

According to another embodiment of the semiconductor device, the high conductivity oxide material forming the high mobility oxide layer exhibits conductivity characteristics which are proportional to mobility characteristics of the high conductivity oxide material.

According to another embodiment of the semiconductor device, the high conductivity oxide material forming the high mobility oxide layer exhibits conductivity characteristics which are inversely proportional to an effective mass of the high conductivity oxide material.

According to another embodiment of the semiconductor device, the high mobility oxide layer includes a high mobility amorphous oxide material.

According to another embodiment of the semiconductor device, the high mobility oxide layer includes a high mobility crystalline oxide material.

According to another embodiment of the semiconductor device, the semiconducting oxide material forming the channel layer exhibits off-state leakage properties which are less than off-state leakage properties characteristics of the high mobility oxide layer.

According to another embodiment of the semiconductor device, the high mobility oxide layer exhibits a potentially lower band gap than the OAS material forming the channel layer.

According to another embodiment of the semiconductor device, metallic contacts exhibit a low contact resistance Rc to the high mobility oxide material forming the high mobility oxide layer.

According to another embodiment of the semiconductor device, the high mobility oxide material of the bi-layer oxides layer includes one of: $SbO_2$, $SnO_2$, $InO_2$, ITO, TiO, ZO, or a high indium content IGZO.

In accordance with yet another embodiment there is a method of fabricating a semiconductor device having bi-layer semiconducting oxides in a source/drain region for low access and contact resistance, in which the method includes: fabricating a substrate for the semiconductor device; depositing a semiconducting oxide material onto the substrate of the semiconductor device forming a channel layer atop the substrate; depositing a high mobility oxide material forming a high mobility oxide layer atop the channel layer, in which the semiconducting oxide material is the first of two oxides forming a bi-layer semiconducting oxides layer of the semiconductor device and in which the high mobility oxide material is the second of the two oxides forming the bi-layer semiconducting oxides layer of the semiconductor device; depositing a gate oxide material atop the semiconducting oxide material of the channel layer and in direct contact with the semiconducting oxide material of the channel layer and depositing metallic gate material forming a gate atop the gate oxide material; positioning spacers atop the high mobility oxide layer adjacent to the gate and gate oxide material; and depositing metallic material forming metallic contacts in direct contact with the high mobility oxide layer and separated from the gate and gate oxide material by the spacers.

According to another embodiment of the method, depositing a semiconducting oxide material onto the substrate of the semiconductor device includes sputtering the semiconducting oxide channel material onto the substrate.

According to another embodiment, the method further includes: depositing an interlayer dielectric (ILD) onto the semiconductor device covering the gate and covering the spacers and covering a contacts region where the metallic contacts are to be deposited atop the high mobility oxide layer prior to depositing the metallic contacts.

According to another embodiment, the method further includes: opening holes into the interlayer dielectric (ILD) at the contacts region where the metallic contacts are to be deposited; and in which depositing the metallic material forming the metallic contacts in direct contact with the high mobility oxide layer includes depositing the metallic material forming the metallic contacts into the holes opened into the interlayer dielectric material at the contacts region of the semiconductor device.

According to another embodiment, the method further includes: patterning the high mobility oxide layer to receive the metallic material forming the metallic contacts prior to depositing the metallic material onto the high mobility oxide layer.

According to another embodiment, the method further includes: etching the previously deposited high mobility oxide material entirely removing the high mobility oxide material in a gate region forming an opening to the semiconducting oxide material of the channel layer through the high mobility oxide material; and in which depositing the gate oxide material atop the semiconducting oxide material of the channel layer and in direct contact with the semiconducting oxide material of the channel layer includes depositing the gate oxide material atop the semiconducting oxide material of the channel layer in the opening formed within the high mobility oxide material to the semiconducting oxide material of the channel layer.

According to another embodiment, the method further includes: thinning the previously deposited high mobility oxide material partially removing the high mobility oxide material in spacer region forming a recess prior to positioning the spacers; and in which positioning the spacers atop the high mobility oxide layer adjacent to the gate and gate oxide material includes positioning the spacers atop the high mobility oxide layer within the recess formed by thinning the high mobility oxide layer in the spacer region.

According to another embodiment of the method, the opening to the semiconducting oxide material of the channel layer through the high mobility oxide material and the recess within the high mobility oxide layer formed from the thinning of the previously deposited high mobility oxide material are both formed via a single etch process; and in which the single etch process is applied to the bi-layer semiconducting oxides layer of the semiconductor device having both the semiconducting oxide material and the high mobility oxide material already deposited and patterned to expose the opening and the recess when etched.

According to another embodiment, the method further includes: etching or undercutting a bottom portion of the positioned spacers opening a gap between the positioned spacers and the semiconducting oxide material of the channel layer; and in which depositing the high mobility oxide material forming the high mobility oxide layer atop the channel layer includes epitaxially growing the high mobility oxide material atop the semiconducting oxide material of the channel layer; and in which the epitaxial growth of the high mobility oxide material atop the semiconducting oxide material of the channel layer fills the gap opened between the positioned spacers and the semiconducting oxide material of the channel layer.

According to another embodiment there is an electronics module including: a printed circuit board; a semiconductor device electrically interfaced to the printed circuit board; and in which the semiconductor device includes: (i) a substrate; (ii) a bi-layer oxides layer formed from a first oxide material and a second oxide material, the first oxide material including a semiconducting oxide material and having different material properties from the second oxide material including a high mobility oxide material; (iii) a channel layer formed atop the substrate, the channel layer formed from the semiconducting oxide material of the bi-layer oxides layer; (iv) a high mobility oxide layer formed atop the channel layer, the high conductivity oxide layer formed from the high mobility oxide material of the bi-layer oxides layer; (v) metallic contacts formed atop the high mobility oxide layer; (vi) a gate and a gate oxide material formed atop the semiconducting oxide material of the channel layer, the gate oxide material being in direct contact with the semiconducting oxide material of the channel layer; and (vii) spacers separating the metallic contacts from the gate and gate oxide material.

According to another embodiment of the electronics module, the electronics module includes one of: a drone and robot control electronics module; a smart phone electronics module; a tablet electronics module; a gesture control electronics module for a computer; a 3D photography electronics module; a 3D immersive gaming electronics module; a face recognition electronics module to perform face recognition base security in-lieu of alphanumerical passwords; an image capture device electronics module having one or more optical and Complementary metal-oxide-semiconductor (CMOS) components affixed to the printed circuit board as the top side or bottom side components; a depth sensing camera electronics module to perform any of stereoscopic imaging depth sensing, coded light depth sensing, or laser time of flight depth sensing.

According to another embodiment, the electronics module includes is embedded within a wearable technology to be worn as one of: a clothing item; sports attire; a shoe; fashion electronics to be worn as a clothing item or an accessory; tech togs to be worn as a clothing item or an accessory; or fashionable technology to be worn as a clothing item or an accessory.

What is claimed is:

1. A semiconductor device, comprising:
   a substrate;
   a bi-layer oxides layer formed from a first oxide material and a second oxide material, the first oxide material comprising a semiconducting oxide material and having different material properties from the second oxide material, wherein the second oxide material comprises a high mobility oxide material;
   a channel layer formed atop the substrate, the channel layer formed from the semiconducting oxide material of the bi-layer oxides layer;
   a high mobility oxide layer formed on a topmost surface of the channel layer, the high mobility oxide layer formed from the high mobility oxide material of the bi-layer oxides layer;
   metallic contacts formed atop the high mobility oxide layer;
   a gate and a gate oxide material formed atop the semiconducting oxide material of the channel layer, the gate oxide material having a bottommost surface being in direct contact with the semiconducting oxide material of the channel layer; and spacers separating the metallic contacts from the gate and gate oxide material.

2. The semiconductor device of claim 1, further comprising an interlayer dielectric (ILD) material covering at least the gate.

3. The semiconductor device of claim 2, wherein the interlayer dielectric (ILD) material comprises an oxide material.

4. The semiconductor device of claim 2:
wherein the interlayer dielectric (ILD) material is deposited onto the semiconductor device covering the gate and covering the spacers and covering a contacts region where the metallic contacts are to be placed atop the high mobility oxide layer;
wherein holes are opened into the interlayer dielectric (ILD) material at the contacts region where the metallic contacts are to be placed; and
wherein the metallic contacts formed atop the high mobility oxide layer are formed by depositing metallic material forming the metallic contacts into the holes opened into the interlayer dielectric material at the contacts region of the semiconductor device.

5. The semiconductor device of claim 1, wherein the high mobility oxide layer comprises a high conductivity oxide material.

6. The semiconductor device of claim 5, wherein the high conductivity oxide material forming the high mobility oxide layer exhibits conductivity characteristics which are proportional to mobility characteristics of the high conductivity oxide material.

7. The semiconductor device of claim 6, wherein the high conductivity oxide material forming the high mobility oxide layer exhibits conductivity characteristics which are inversely proportional to an effective mass of the high conductivity oxide material.

8. The semiconductor device of claim 1, wherein the high mobility oxide layer comprises a high mobility amorphous oxide material.

9. The semiconductor device of claim 1, wherein the high mobility oxide layer comprises a high mobility crystalline oxide material.

10. The semiconductor device of claim 1, wherein the semiconducting oxide material forming the channel layer exhibits off-state leakage properties which are less than off-state leakage properties characteristics of the high mobility oxide layer.

11. The semiconductor device of claim 1, wherein the high mobility oxide layer exhibits a lower band gap than the semiconducting oxide material forming the channel layer.

12. The semiconductor device of claim 1, wherein metallic contacts exhibit a low contact resistance Rc to the high mobility oxide material forming the high mobility oxide layer.

13. The semiconductor device of claim 1, wherein the high mobility oxide material of the bi-layer oxides layer comprises one of: $SbO_2$, $SnO_2$, $InO_2$, ITO, TiO, ZO, or a high indium content IGZO.

14. An electronics module comprising:
a printed circuit board;
a semiconductor device electrically interfaced to the printed circuit board; and
wherein the semiconductor device comprises:
(i) a substrate;
(ii) a bi-layer oxides layer formed from a first oxide material and a second oxide material, the first oxide material comprising a semiconducting oxide material and having different material properties from the second oxide material, wherein the second oxide material comprises a high mobility oxide material;
(iii) a channel layer formed atop the substrate, the channel layer formed from the semiconducting oxide material of the bi-layer oxides layer;
(iv) a high mobility oxide layer formed on a topmost surface of the channel layer, the high mobility conductivity oxide layer formed from the high mobility oxide material of the bi-layer oxides layer;
(v) metallic contacts formed atop the high mobility oxide layer;
(vi) a gate and a gate oxide material formed atop the semiconducting oxide material of the channel layer, the gate oxide material having a bottommost surface being in direct contact with the semiconducting oxide material of the channel layer; and
(vii) spacers separating the metallic contacts from the gate and gate oxide material.

15. The electronics module of claim 14, wherein the electronics module comprises one of:
a drone and robot control electronics module;
a smart phone electronics module;
a tablet electronics module;
a gesture control electronics module for a computer;
a 3D photography electronics module;
a 3D immersive gaming electronics module;
a face recognition electronics module to perform face recognition base security in-lieu of alphanumerical passwords;
an image capture device electronics module having one or more optical and Complementary metal-oxide-semiconductor (CMOS) components affixed to the printed circuit board as the top side or bottom side components;
a depth sensing camera electronics module to perform any of stereoscopic imaging depth sensing, coded light depth sensing, or laser time of flight depth sensing.

16. The electronics module of claim 14, wherein the electronics module comprises is embedded within a wearable technology to be worn as one of:
a clothing item;
sports attire;
a shoe;
fashion electronics to be worn as a clothing item or an accessory;
tech togs to be worn as a clothing item or an accessory; or
fashionable technology to be worn as a clothing item or an accessory.

* * * * *